United States Patent [19]

Reynolds

[11] 3,789,322

[45] Jan. 29, 1974

[54] MICROWAVE CAVITY TUNING LOOP INCLUDING A VARACTOR

[75] Inventor: Allan L. Reynolds, White Plains, N.Y.

[73] Assignee: United Aircraft Corporation, East Hartford, Conn.

[22] Filed: Nov. 24, 1972

[21] Appl. No.: 309,568

Related U.S. Application Data

[63] Continuation of Ser. No. 156,726, June 25, 1971, abandoned.

[52] U.S. Cl. ............................... 331/96, 331/107 G

[51] Int. Cl. ............................................. H03b 7/06

[58] Field of Search ............................... 331/107, 96

[56] References Cited

UNITED STATES PATENTS

| | | | |
|---|---|---|---|
| 3,416,098 | 12/1968 | Vane | 331/107 |
| 3,452,305 | 6/1969 | Hefni | 331/96 |
| 3,474,351 | 10/1969 | Cook et al. | 331/96 |
| 3,512,105 | 5/1970 | Lance, Jr. et al. | 331/96 |
| 3,601,723 | 8/1971 | Johnson | 331/96 |
| 3,628,171 | 12/1971 | Kurokawa | 331/107 |
| 3,646,357 | 2/1972 | Grace | 331/107 |
| 3,688,219 | 8/1972 | Havens | 331/96 |

*Primary Examiner*—John Kominski
*Attorney, Agent, or Firm*—Melvin Pearson Williams

[57] ABSTRACT

A coupling loop having a varactor in series therewith extends into a microwave cavity, which in one embodiment includes a coaxially aligned transferred electron device (TED) oscillator, with aperture output coupling into a waveguide. Bias for the varactor is applied by coaxial waveguide circuitry, the outer conductor of which is integral with the coupling loop, the circuitry including a low pass filter and a microwave energy absorbing means. Means are provided to ensure that the cavity wall adjacent the varactor is a microwave short circuit. Ancillary structures includes a tellurium copper heat sink, including a collet type heat sink mount for the TED, invar tuning screws in the cavity and waveguide which are formed of aluminum walls, and other structural details.

1 Claim, 4 Drawing Figures

INVENTOR
ALLAN L. REYNOLDS
BY Melvin Pearson Williams
ATTORNEY

MICROWAVE CAVITY TUNING LOOP INCLUDING A VARACTOR

This is a X continuation, of application Ser. No. 156,726, filed June 25, 1971 and now abandoned.

BACKGROUND OF THE INVENTION

1. Field of Invention

This invention relates to microwave cavities, and more particularly to improvements in varactor-tuned microwave cavities.

2. Description of the Prior Art

Recent advancements in the microwave field, particularly in the field of radar, have resulted in successive increases in the maximum frequencies which are capable of being achieved, and which are desired for specific applications. For instance, in the field of radar, the Ku band has been found most advantageous in applications where extremely high resolution is required, such as in terrain avoidance and all-weather guidance, target detection and weapon delivery systems. The Ku-band extends approximately between 12.4 and 18 GHZ. There are also a large number of applications in the X band, which extends downward from the Ku-band to about 8.2 GHz. In order to provide oscillators at these frequencies, the first development has been the use of transistor oscillators, which have heretofore had limitations on the order of 5 GHz, but as the frequencies are increased, the power capacities, reliability and other factors are decreased. The usual type of transistor oscillator therefore operates at a lower frequency (perhaps with a maximum of 2 GHz) utilizing transistor frequency multipliers to increase the frequency into the desired range. However, whenever a frequency multiplying system is used, its output has all of the harmonics of the original wave which are, for the intended purpose, undesirable elements, and which require filtering in order to remove. Because of the additional hardware required to oscillate and mutliply the basic frequency and filter the final frequency, the equipment is more complex (and therefore suffers from less reliability than is desirable), and results in tradeoffs in weight, size and cost which are undesirable in all airborne applications.

To overcome some of the difficulties of the oscillator/multiplier systems known to the art, a recent innovation has been the utilization of bulk-effect semiconductor devices, such as are frequently referred to as GUNN oscillators or transferred electron devices (TED). However devices of this type known to the art suffer from a limited tuning range, or very low output power in addition, when such devices are subjectd to temperature variations of the type normally encountered in many applications (particularly airborne applications), the characteristics of these devices degrade still further.

In modern airborne radar systems, it is essential that the radar be able to operate on different frequencies. For instance, in order to avoid interference in the radar of a first aircraft from the radar of another aircraft, the firt aircraft may change its radar frequency. This is done by altering the basic frequency of the magnitron in the transmitter, and the local oscillator in the receiver must be made to respond so as to still heterodyne to the same IF frequency. As examples, in Ku band radar, there may be an 800 to 1200 megacycle tuning range required for any given application. A cavity operating in the Ku band must therefore be able to adjust within a very short period of time (microseconds) so as to follow the basic operating frequency of the radar. Of the two most common types of electronic tuning devices, YIG (yttrium, iron, garnet) and varactor, the YIG device is too slow for this application, and the varactor devices known to the prior art have insufficient tuning range.

Also, varactor-tuned cavities of the prior art utilized with TED devices in X or Ku band oscillators have additional adverse characteristics. For instance, in addition to insufficient tuning range, they are very prone to generating noise signals at some points in the tuning spectrum and jumping frequency as the tuning voltage is varied.

SUMMARY OF INVENTION

The object of the present invention is to provide an improved microwave cavity.

According to the present invention, a coaxial microwave cavity has a coupling loop extending radially into the cavity, said coupling loop including a varactor in series therewith, thereby to vary the capacitance of the loop and hence to tune the cavity. In further accord with the present invention, the cavity in accordance herewith includes a transferred electron device thereby constituting a microwave oscillator. In still further accord with the present invention, energy is coupled from the oscillator cavity by means of aperture coupling into a standard waveguide.

In accordance with the invention in one form, the capacitive cavity tuning loop is biased through microwave circuitry including a low-pass filter in series with a microwave energy absorber, thereby isolating the capacitive loop from the bias circuitry.

The present invention provides improved means for electrically controlling the resonant frequency of a microwave cavity. The present invention not only achieves, across a given tuning range, higher power than has heretofore been available in the equivalent tuning range, but the flatness of the output power as a function of frequency and as a function of temperature is better than that heretofore achievable.

The foregoing and other objects, features and advantages of the present invention will become more apparent in the light of the following detailed description of preferred embodiments thereof, as illustrated in the accompanying drawing.

DESCRIPTION OF THE PREFERRED EMBODIMENT

Figures 1, 2, 3, 4:
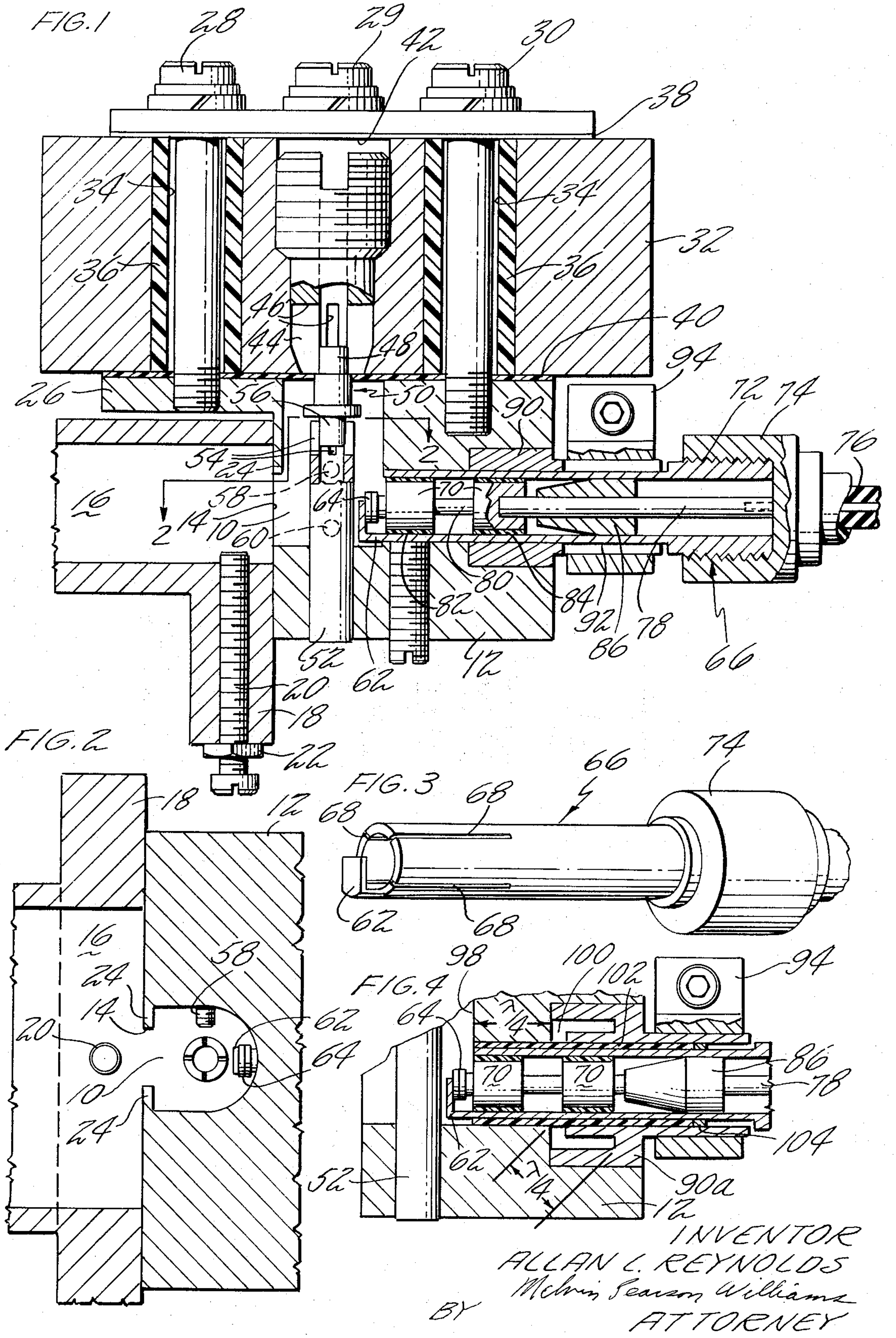
FIG. 1 is a sectioned side elevation of one embodiment of a microwave cavity in accordance with the present invention.
FIG. 2 is a section taken on the line 2—2 in FIG. 1.
FIG. 3 is a perspective view of the varactor-holding coupling loop and integral bias conductor in accordance with the present invention.
FIG. 4 is a partial sectioned side elevation of alternative bias supplying means which may be substituted into the embodiment of FIG. 1.

Referring now to FIGS. 1 and 2 a microwave cavity 10 having a generally D-shaped cross section is formed within an aluminum cavity block 12 and has an aperture 14 for the output coupling of microwave energy from the cavity 10 into a standard waveguide 16. The waveguide 16 has a flanged end portion 18 which facilitates bolting of the waveguide 16 to the cavity block 12, in any standard, well known manner, not shown herein. The flange 18 is tapped to receive a stainless steel tuning screw 20 having a lock nut 22 thereon. Adjustment of this screw introduces a variable amount of capacitance in the waveguide to tune the waveguide for maximum power coupling between the cavity 10 and the waveguide 16. A wall 24 between the cavity 10 and the waveguide 16, in which the aperture 14 is formed, is made very thin so as to facilitate maximum power coupling between the cavity 10 and the waveguide 16. This is facilitated in this embodiment by having a flanged portion 26 extending from the block 12 to permit bolting a tellurium copper heat sink block 32 directly to the cavity block 12 by means of machine screws 28–30. The machine screws 28–30 pass through holes 34 in the block 32 which may be made oversized, thus providing insulation by means of lack of contact between the bolts 28–30 and the heat sink block 32; and, if desired, the holes 34 may include suitable insulation 36 therein, which may comprise insulator inserts of a material such as that sold under the brand name Teflon. The heads of the machine screws 28–30 are insulated from the heat sink block 32 by means of a Mylar gasket 38, and the cavity block 12 is insulated from the heat sink block 32 by means of a Mylar gasket 40. The gasket 40 is thin, so that the blocks 12 and 32 are short circuited to microwave energy. Within the heat sink block 32 is a chamfer hole 42 within which a chamfer, slotted collet-type of gripping device 44 is threaded, the device having slots 46 cut in the end thereof so as to make deformable fingers which, as the result of the chamfer on the device 44 mating with the chamfer in the hole 42, will grip the heat sink portion 48 of a TED 50, which device is coaxially mounted within the cavity 10 by means of a hollowed out cylindrical member 52 having end cuts 54 therein to provide spring fingers to grip the anode 56 of the TED 50. The cavity 10 is adjustable by means of invar tuning screws 58, 60 (best seen in FIG. 2). The DC bias voltage, which is in the neighborhood of 4 to 7 volts as is known in the art, is applied to the TED 50 by applying a negative voltage to the heat sink block 32 and a positive voltage to the cavity block 12.

Tuning of the cavity 10 is accomplished, in accordance with the invention, by means of a coupling loop 62 which grips a varactor diode 64 which, as is well known, comprises a back-biased p-n junction diode, the capacitance of which varies as a function of the DC bias voltage supplied thereto. Thus the coupling loop 62 has a variable capacitance therein, the capacitance thereof, and therefore the tuning effect of the loop 62, being dependent upon the magnitude of the back bias supplied to the varactor 64.

The loop 62 is illustrated more clearly in FIG. 3, wherein it is seen to comprise a bent tongue extending from the periphery of a hollowed out cylinder 66 which has slots 68 therein which are flared outward to permit gripping of the inner surface of the hole through which it is fed (to insure good electrical contact), includes threads 72 to receive a connector 74 by means of which varactor tuning bias potential is applied from a coaxial conductor 76 through a central conductor 78 to the bar-bell type device 70. The device 70 is made of a good conducting material such as copper or brass, and by means of its configuration is the equivalent, at microwave frequencies, of a low pass filter: providing inductance at a reduced portion 80 thereof and capacitance across Mylar sleeves 82, 84. Disposed about the central conductor 78 is an annular microwave energy absorber 86 which may comprise a material sold under the brand name Raydite, or other suitable material. The central conductor 78 may preferably be soldered to the central conductor element of the coaxial conductor 76 and to the member 70.

Surrounding the cylindrical member 66 is an aluminum sleeve insert 90 (preferably press fit into the cavity block 12 so as to be rigidly secured therein) which may have saw cuts 92 therein to permit an annular clamping means 94 to grip the cylinder member 66 to the sleeve insert 92. In operation, the entire cylinder member 66, with the varactor 64 mounted therein, may be moved to the right and left as seen in FIG. 1 to groos-tune the cavity 10 to a desired central frequency, and then the clamp 94 may be tightend so as to prevent further sliding of the member 66 within the sleeve insert 90.

The embodiment of the invention just described comprises a complete microwave oscillator having cavity tuning screws, groos positioning for a varactor tuning diode, an output aperture and power coupling adjustment means for the aperture. The oscillator includes a transferred electron device 50 with maximum heat transfer into a heat sink block. Bias to the varactor tuning device is applied through coaxial microwave circuitry including a low pass filter and microwave absorber.

In the embodiment of FIG. 1, the integrity of the cavity 10 requires that the portion of the cavity wall through which the tuning loop 62 extends, be a complete short circuit to microwave energy. In other words, the coupling loop 62 must extend from a microwave short circuit wall. This is achieved in the embodiment of FIG. 1 by flaring out the spring fingers formed by the slots 68 in the member 66 (FIG. 3) so that the member makes good electrical contact with the inner surface of the hole in the cavity block 12 in which the member 66 is placed. Also, by using Mylar inserts 82 that are very thin, the left end of the bar bell device 70 appears to be short-circuited to the cavity block 12 at microwave frequencies. In a second embodiment of the invention, as illustrated in FIG. 4, the short circuit of the cavity wall immediately adjacent to the tuning loop 62 is ensured by using a quarter-wave cavity 100 which is formed within a modified version of the pressed-fit, aluminum sleeve insert **90*a*, insulated from the cylindrical member 66 by a Mylar sleeve 102. As is known in the art, if the total length of the annular cavity 100 is one-quarter wave length, and it is displaced one quarter wave length from the wall 98 which is desired to be a short circuit, and a half a wavelength from an annular shorting ring 104, a short circuit will be seen at the surface along the wall 98 between the cylindrical member 66 and the cavity block 12. Under these conditions, it is the same as if the coupling loop 62** is extending from a solid metallic wall.

Thus, the invention has been described as consisting of a coupling loop 62 having the varactor diode 64 in series therein, which provides precise electronic control over the tuning of the cavity 10; the embodiment herein comprises an oscillator including a bulk effect transferred electron device 50 but the invention is equally applicable in other microwave cavities, such as in filter cavities. An oscillator continuously tunable across about 1200 MHz in the X and Ku bands, with high spectral purity, has been achieved in accordance with the invention.

Although the invention has been shown and described with respect to preferred embodiments thereof, it should be understood that the foregoing and various other changes and omissions in the form and detail thereof may be made therein without departing from the spirit and the scope of the invention.

Having thus described typical embodiments of my invention, that which I claim as new and desire to secure by Letters Patent of the United States is:

1. An electrically tunable microwave cavity comprising:

a conductive block structure having a microwave cavity formed as a void therein, said cavity including a first wall surface having an opening therethrough comprising a hole through said conductive block, and a thin second wall having an aperture therein for coupling energy out of said cavity;

a hollow, elongated conductive cylinder extending through said hole, said cylinder having a bent tongue-like extension on an end thereof, said tongue-like extension extending into said cavity;

a central conductor coaxially disposed in said cylinder, said central conductor including a conductive, bar bell type of low pass filter, one end of said filter being adjacent said first wall surface;

a microwave energy absorber surrounding said central conductor along at least a portion of its length;

a thin insulating sleeve disposed between said cylinder and said central conductor, said insulating sleeve being sufficiently thin so that said first wall surface and the ends of said cylinder and said filter adjacent said cavity form a surface which is a short circuit to microwave energy; and a varactor diode in contact with said tongue-like extension and the end of said filter, thereby forming a tunable conductive coupling loop extending into said cavity from said short circuit surface, said cylinder and central conductor adapted to be connected to a voltage source for the application of DC bias to said varactor diode.

* * * * *